(12) United States Patent
Boeh

(10) Patent No.: US 7,072,930 B2
(45) Date of Patent: Jul. 4, 2006

(54) BINARY COUNTER

(75) Inventor: Frank Boeh, Rosengarten (DE)

(73) Assignee: Koninklijke Philips Electronics N.V., Eindhoven (NL)

( * ) Notice: Subject to any disclaimer, the term of this patent is extended or adjusted under 35 U.S.C. 154(b) by 730 days.

(21) Appl. No.: 10/235,441

(22) Filed: Sep. 5, 2002

(65) Prior Publication Data

US 2003/0081466 A1    May 1, 2003

(30) Foreign Application Priority Data

Sep. 7, 2001   (DE) ................................ 101 44 077

(51) Int. Cl.
G06F 7/50        (2006.01)
(52) U.S. Cl. ..................................... 708/672
(58) Field of Classification Search ................ 708/672
See application file for complete search history.

(56) References Cited

U.S. PATENT DOCUMENTS 5,410,721 A * 4/1995 Divine et al. ............... 712/245
5,682,342 A * 10/1997 Suzuki ........................ 708/672
5,889,693 A * 3/1999 Joshi et al. .................. 708/672
6,675,188 B1 * 1/2004 Minami et al. .............. 708/672

* cited by examiner

Primary Examiner—D. H. Malzahn
(74) Attorney, Agent, or Firm—Adam L. Stroud

(57) ABSTRACT

Method for realizing a binary counter that changes a partly permuted data word stored in a non-volatile memory and including a counter and a working memory and storing a data word in the form of memory words in the non-volatile memory. The method further comprises reading the memory words of the data word and storing the memory words in the working memory while performing an inverse reordering of k permutation bits of the data word, applying an inverse bijective mapping function to the k permutation bits of the data word, altering the data word, applying a bijective mapping function to the k permutation bits of the data word, performing a reordering of the k permutation bits, and checking each memory word for deviations from the memory word stored in the non-volatile memory and storing only those memory words in the non-volatile memory again for which this is the case.

7 Claims, 1 Drawing Sheet

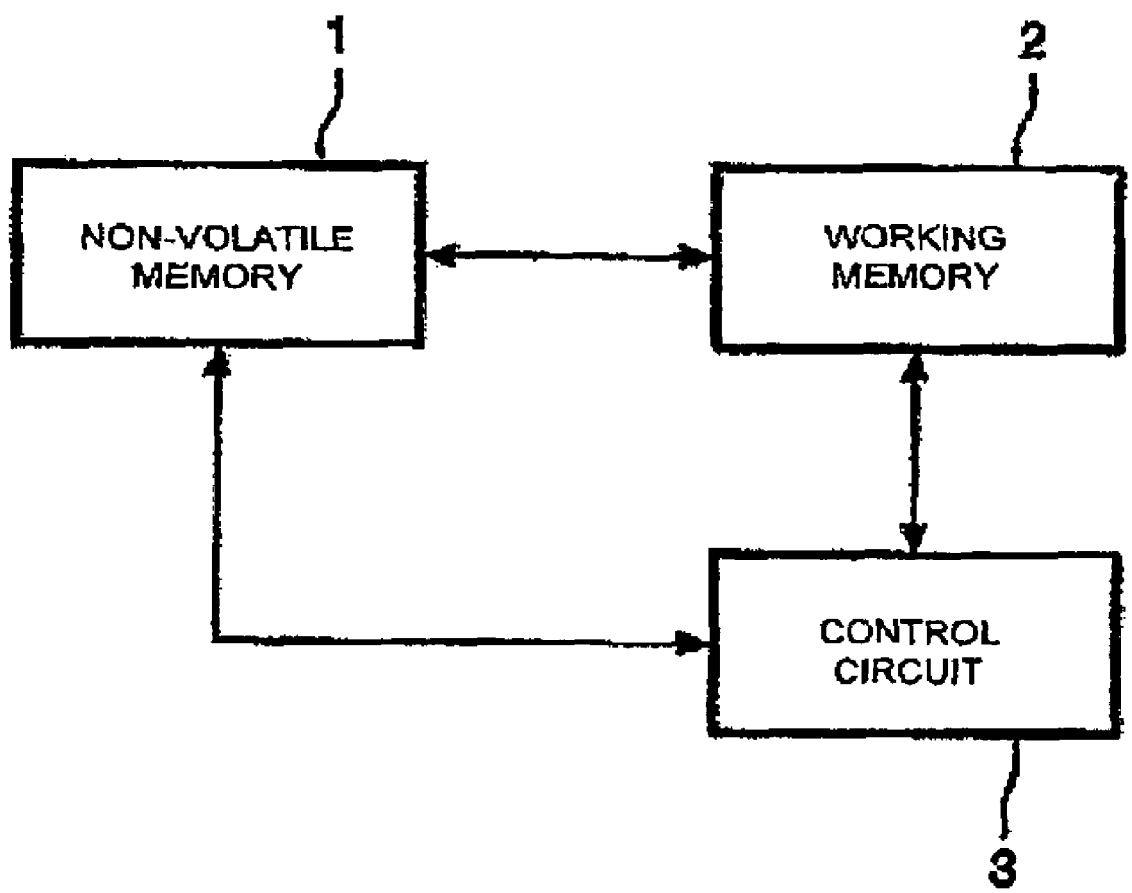

BINARY COUNTER

The invention relates to an arrangement for realizing a binary counter which increments or decrements a data word which is stored in a non-volatile memory, which arrangement is provided with a counter and a working memory.

Arrangements of this kind are known from prior art and operate in such a manner that they read a data word from the non-volatile memory and transfer it to a working memory. In the working memory the data word is incremented by binary addition of the number 1 (or a different number), thus incrementing the counter reading of the word. The data word with the incremented counter reading is written back into the non-volatile memory. Decrementing by 1 or a different number is also possible.

Arrangements of this kind are used, for example, for radio keying systems for vehicles in which the binary value of the counter is encrypted by means of cryptographic methods and is transferred to the vehicle by the radio key. Because the radio key is typically battery operated and the battery can be exchanged, the counter reading of the data word is stored in an EEPROM whose content is not lost in the event of a change of battery.

However, a problem is encountered in that notably the least significant bits of the data words change in response to any decrementing or incrementing of the counter reading of the data word, so that for every new counter reading all bits of the data word have to be written into the EEPROM again. This gives rise to comparatively heavy loading of the memory cells which typically allow for only a limited number of write cycles in the case of an EEPROM, meaning that their service life is determined by the number of write cycles.

It is an object of the invention to provide an arrangement of the kind set forth which necessitates an as small as possible number of write cycles in the EEPROM.

This object is achieved in accordance with the invention in that the arrangement for realizing a binary counter which decrements or increments a partly permuted data word which is stored in a non-volatile memory is provided with a counter and a working memory, a data word being stored in the form of at least two memory words in the non-volatile memory, which arrangement:

reads the memory words of the data word from the non-volatile memory and stores these memory words in the working memory while performing an inverse reordering of k permutation bits of the data word, applies an inverse bijective mapping function (permutation) to the k permutation bits of the data word, decrements or increments the data word, applies a bijective mapping function (permutation) to the k permutation bits of the data word, performs a reordering of the k permutation bits, and checks for each memory word whether it deviates from the memory word stored in the non-volatile memory and stores only those memory words in the non-volatile memory again for which this is the case, in order to increment a data word stored in the non-volatile memory, the bijective mapping function (permutation) being such that the k least significant bits of the data word, representing the k permutation bits whereto the mapping function is applied, change as infrequently as possible and approximately equally frequently due to the decrementing or incrementing after application of the mapping function, the reordering being performed in such a manner that the k permutation bits of the data word in the working memory are distributed among k memory words in the volatile memory.

The basic idea of the invention is to store the data word in the memory not as such, that is, in unchanged form, but in partly permuted form and with reordered bits. Permutation in this context is to be understood to mean that k permutation bits of the data word are subjected to a bijective mapping function and are stored in the non-volatile memory in this permuted form. The bijective mapping function is conceived to be such that each permutation bit of the k permutation bits whereto the mapping function is applied per se changes as infrequently as possible due to the decrementing or incrementing after application of the mapping function, and that all permutation bits change approximately equally frequently.

The k permutation bits subjected to the bijective mapping function are distributed among k memory words. In this context memory words are to be understood to be the words in the non-volatile memory into which the data word has been subdivided.

As a result of such application of the bijective mapping function and reordering of the permuted k permutation bits it is achieved that the memory words of the data word change approximately equally frequently and notably that not every one of the memory words changes in response to each decrementing or incrementing operation. The bijective mapping function is actually conceived to be such that, from a statistical point of view, the decrementing or incrementing operations cause each of the memory words of the data words to change approximately equally frequently.

However, this means that after every decrementing or incrementing operation only approximately one memory word changes. The other memory words remain the same. Therefore, when the data word is rewritten after application of the bijective mapping function, it is checked which memory words in the working memory deviate from the corresponding memory word in the non-volatile memory. Generally speaking, only one memory word will deviate. When the decremented or incremented data word in which the permutation bits have been subjected to the bijective mapping function and reordering is written back, only the memory word which has actually changed relative to the memory word still stored in the non-volatile memory will actually be written back.

It is thus achieved that only one memory word of the data word need actually be written back into the non-volatile memory after each decrementing or incrementing operation and that from a statistical point of view these write operations are distributed approximately equally among all memory words of the data word. The number of write operations is thus substantially reduced in relation to the individual words of the non-volatile memory. Notably all cells are loaded to the same extent. For example, in the case of four memory words approximately four times as many, from a statistical point of view, decrementing or incrementing operations can be performed, and the correspondingly changed data words written in the non-volatile memory, in comparison with the present state of the art.

In the simplest case the reordering of the permutation bits in memory words can be performed by writing the permutation bits in free positions provided in the memory words for this purpose. However, the bit width of the memory words is then affected by the permutation bits. In order to avoid this, it is arranged that the permutation bits change position with other bits provided in the memory words. Consequently, no additional storage capacity is required by the permutation bits.

The width of the counting step upon decrementing or incrementing may in principle amount to an arbitrary number. In conformity with a further version of the invention, however, the step width amounts to one and the number k of permutation bits is equal to the number of memory words of a data word.

In the case where the counting step width upon decrementing or incrementing equals one, an optimum result is obtained already when there are provided exactly as many permutation bits as there are memory words in the data word. For example, when the data word has four memory words, an optimum result is obtained already when the four least significant bits in the data word are used as permutation bits.

The above properties of the bijective mapping function are realized when, in conformity with a further version of the invention, each time only one bit changes in response to each decrementing or incrementing operation after application of the bijective mapping function to the permutation bits. This again means that only one memory word changes relative to the previous counter reading and also that only this memory word need be written into the non-volatile memory again.

In conformity with a further version of the invention, the bijective mapping function can be advantageously realized in such a manner that a table is formed in which the four permutation bits are stored in non-permuted form. For the four data words then quasi-appearing, not being identical to the counter data words, each time one data word of four permutation bits can be indicated in permuted form in the table. The application of the bijective mapping function (permutation) can thus be realized by application of this table.

The bijective mapping function can in principle be formed by trial and error. It is to be conceived in such a manner that among the k permutation bits each time only one bit changes by application of the bijective mapping function upon decrementing or incrementing. An advantageous method of forming the bijective mapping function in conformity with a further version of the invention is characterized in that a search tree strategy is employed. In such a search tree the k permutation bits are always entered in permuted form as the permutation word for each level. In the search tree new levels are formed each time in that, starting from a permutation word with the k permutation bits, a new permutation word with k permutation bits is entered, be it that only one of these bits has changed for the new level. It is thus possible to form branches in the search tree along which always only one bit among the k permutation bits changes per level. In this respect it is to be noted that those of the newly entered permutation words of the k permutation bits which have already occurred at the higher levels are deleted. Furthermore, the frequency of change must be noted for each bit of the k permutation bits in the branches of the search tree, because each bit of the k permutation bits may change only k times in a complete branch of the search tree.

When a search tree is formed in this manner, some branches will inherently be terminated early, because the above requirements are not satisfied for the relevant branch. However, there will also be branches in which all feasible $2^k$ levels can be formed. Along these branches, for which all conditions are satisfied, there is formed a sequence of data words which can be used as permutation words of the k permutation bits. For the k permutation bits in the permutation words it is then defined, for example, on the basis of a table, how the k permutation bits of the permutation words which have been decremented or incremented are to be transferred to the bits of the permutation data words upon application of the bijective mapping function.

An embodiment of the invention will be described in detail hereinafter with reference to the sole FIGURE of the drawing.

The FIGURE shows a block diagram of an arrangement in accordance with the invention which includes a non-volatile memory 1.

The non-volatile memory 1, being an EEPROM, stores a data word which is to be decremented or incremented. For the decrementing or incrementing in principle a counting operation can be carried out with an arbitrary step width, but the step width usually equals 1. It will be assumed hereinafter that a data word stored in the memory 1 has a bit width of 32 bits and is stored in the non-volatile memory 1 in the form of four memory words of 8 bits each. Furthermore, it is also assumed hereinafter that each counting operation (to be described in detail hereinafter) concerns the incrementing of the data word with a step width equal to 1. Thus, in every incrementing operation the digital number 1 is added to the data word.

In order to enable such a counting operation, the arrangement shown in the FIGURE is provided with a working memory 2. There is also provided a control circuit 3 which is preferably a microprocessor.

In arrangements of this kind which are known from the present state of the art the incrementing of the data word stored in the non-volatile data memory 1 is realized in that the data word is transferred from the non-volatile memory 1 to the working memory 2 in which it is incremented and subsequently it is written into the non-volatile memory 1 again. This operation is controlled by the control circuit 3.

It will be evident that according to the solutions which are known from the present state of the art each incrementing operation in the working memory 2 gives rise to the problem that the bits of the memory word which contains the least significant bits of the data word change after every incrementing operation, so that in any case this memory word must be written into the non-volatile memory 1 again after each incrementing operation.

However, there is the problem that non-volatile memories, for example, EEPROMs, allow for only a limited number of write cycles. Therefore, the aim is to keep the number of write cycles as small as possible for each memory cell of a non-volatile memory.

Consequently, in the arrangement in accordance with the invention it is arranged that the k least significant bits of the data word are subjected to a bijective mapping function prior to the rewriting from the working memory 2 to the non-volatile memory 1, and to distribute these bits uniformly among the four memory words of the data word in the present example. As will be described in detail hereinafter, it is thus achieved that in each incrementing operation only one memory word changes in the data words with the already permuted permutation bits. When the data word with the four memory words containing the already permuted permutation bits is written back in the non-volatile memory 1, the control circuit 3 checks which of these memory words, still being stored in the working memory 2 for the time being, deviate from the memory words stored in the non-volatile memory 1. Only the memory words which have changed are written into the memory 1 again.

Because the bijective mapping function is conceived to be such that, after the execution of the incrementing operation and application of the bijective mapping function to the permutation bits, the permutation bits change as infrequently as possible and that they all change approximately equally frequently, it is achieved that per incrementing operation only approximately one memory word has to be written into the non-volatile memory again upon a rewrite operation from the working memory 2 to the non-volatile memory 1 in the example involving four memory words of 8 bits. Moreover, from a statistical point of view all four memory words are equally frequently involved in this rewrite operation. Because the permutation bits in permuted form all change approximately equally frequently, it is also achieved that the four memory words are also involved approximately equally frequently in the rewrite operation.

The operation of the arrangement in accordance with the invention as shown in the FIGURE will be described in detail hereinafter.

The data word which is to be incremented and comprises the four permuted permutation bits is stored in the non-volatile memory 1. In order to increment the data word, it is loaded from the non-volatile memory 1 to the working memory 2. The permutation bits, having been shifted to new positions within the data word, are shifted to their initial positions again and an inverse bijective mapping function is applied, so that the permuted permutation bits are converted back again to their non-permuted initial values. The data word is then available again in the working memory in unmodified form, that is a form which has not been partly permuted and reordered. This data word can then be incremented in the working memory 2 by means of the control circuit 3. After this incrementing operation, in the present example four permutation bits of the data word are subjected to a bijective mapping function which will be described in detail hereinafter. These four permutation bits are the four least significant bits of the data word. After this permutation operation, the four permuted permutation bits are uniformly distributed among the four memory words, that is, each of the permutation bits is shifted in one of the memory words. It is then advantageous to carry out an exchange with other bits which were present in the corresponding positions of the memory words.

After this reordering operation, therefore, each memory word contains one permutation bit. Because of the concept of the bijective mapping function, each of these permutation bits in the present example changes approximately after every fourth incrementing operation. Because said four permutation bits are the least significant bits of the data word and hence the bits which change most frequently, the four permuted permutation bits, having been distributed among the four memory words, determine the frequency of change of the memory words. Because all of the four permutation bits again change approximately equally frequently, that is approximately every fourth incrementing operation, it is achieved for the four memory words that only approximately one of the four memory words changes after each incrementing operation and that this frequency of change is uniformly distributed among the four memory words.

In order to achieve an actual reduction of the number of write operations in the non-volatile memory 1, prior to the rewriting of the memory words in which the permutation bits are present in permuted form it is checked whether these memory words have actually changed relative to the memory words still stored in the non-volatile memory 1 as a result of the preceding incrementing operation. A rewrite operation for the newly formed memory words from the working memory 2 to the non-volatile memory 1 takes place only for those memory words which have actually changed. For the reasons mentioned above, therefore, from a statistical point of view it will be necessary to rewrite only one of the four memory words into the non-volatile memory 1 after each counting operation. Thus, in relation to the individual memory cells of the non-volatile memory 1 a reduction of the write operations by approximately a factor of four is achieved in comparison with the solutions known from the present state of the art. An extension of the service life of the non-volatile memory 1 by the same factor is thus achieved; in other words, in relation to the service life of the non-volatile memory 1 approximately four times as many incrementing operations can be carried out.

The execution of the permutation and the reordering will be illustrated again hereinafter on the basis of some mathematical representations.

The equation (1)

$$C = [\, C_{31}\ C_{30}\ C_{29}\ C_{28}\ C_{27}\ C_{26}\ C_{25}\ C_{24}\ C_{23}\ C_{22}\ C_{21} \quad\quad (1)$$
$$C_{20}\ C_{19}\ C_{18}\ C_{17}\ C_{16}\ C_{15}\ C_{14}\ C_{13}\ C_{12}\ C_{11}\ C_{10}\ C_9$$
$$C_8\ C_7\ C_6\ C_5\ C_4\ C_3\ C_2\ C_1\ C_0\,]$$

represents a data word with 32 bits, for example, as it may be present in the working memory 2. This data word has not been permuted or, more exactly speaking, no bits of the data word have been permuted. This data word C is the data word whose value is to be incremented. The bit $C_0$ is the least significant bit and the bit $C_{31}$ is the most significant bit. At least the least significant bit $C_0$ changes during each counting operation. The frequency of change of the individual bits increases in the direction from the most significant bit $C_{31}$ to the least significant bit $C_0$. This means that the least significant bits change most frequently. Because the data word C in conformity with the equation 1 is to be rewritten into the non-volatile memory 1 as shown in the FIGURE, that is, each time after the incrementation, a very high write load arises for the memory word containing the least significant bit, because the least significant bits change after every incrementing operation and hence every time a write operation is required in the non-volatile memory 1. In order to avoid this problem, the arrangement in accordance with the invention involves a permutation and reordering.

In the present example the data word C in conformity with the equation 1 is subdivided into four memory words upon rewriting into the non-volatile memory 1. In order to achieve approximately the same frequency of change for these four memory words, the four least significant bits in the data word in conformity with the equation 1 are subjected to a bijective mapping function, meaning that they are permuted. The equation 2 illustrates this in general form for k bits to be permuted:

$$P(C_{k-1}C_{k-2}\ldots C_1C_0) = (P_{k-1}P_{k-2}\ldots P_1P_0) \quad\quad (2)$$

(k=number of bits to be permuted).

In the present example k should be equal to 4 because the data word is subdivided into four memory words and four permutation bits already offer an optimum result for four memory words:

$$p(C_3C_2C_1C_0) = (P_3P_2P_1P_0) \quad\quad (3)$$

The permutation operation takes place only after the incrementing of the counter word. The equation 4

$$C' = [\, C_{31}\ C_{30}\ C_{29}\ C_{28}\ C_{27}\ C_{26}\ C_{25}\ C_{24}\ C_{23}\ C_{22}\ C_{21} \quad\quad (4)$$

-continued $$[C_{20}\ C_{19}\ C_{18}\ C_{17}\ C_{16}\ C_{15}\ C_{14}\ C_{13}\ C_{12}\ C_{11}\ C_{10}\ C_9$$
$$C_8\ C_7\ C_6\ C_5\ C_4\ P_3\ P_2\ P_1\ P_0]$$

shows the four permutation bits $P_0$ to $P_3$ formed by applying a bijective mapping function to the four bits $C_0$ to $C_3$ of the data word C after the incrementing of the data word. The bijective mapping function is configured to be such that the four permutation bits $P_0$ to $P_3$ in permuted form change approximately equally frequently under the influence of the incrementing operations. For the present example, involving four permutation bits, this means that after every counting operation of the data word C and application of the bijective mapping function to the four bits $C_0$ to $C_3$ of the data word C, resulting in the permuted data word C' which contains the permutation bits in permuted form, only approximately one of the four permutation bits $P_0$ to $P_3$ changes from a statistical point of view.

It is thus achieved that the four least significant bits in this permuted form exhibit approximately the same frequency of change.

In order to make optimum use of this property of the four permutation bits, the four permutation bits $P_0$ to $P_3$ are distributed among the four memory words of the data word, that is, each time one permuted permutation bit is set in each of the four memory words.

This results in a structure of memory words $E'_0$ to $E'_3$ which is in conformity with the equation 5

$$E'_0 = [E_{31}E_{30}E_{29}E_{28}E_{27}E_{26}E_{25}P_3]$$

$$E'_1 = [E_{23}E_{22}E_{21}E_{20}E_{19}E_{18}E_{17}P_2]$$

$$E'_2 = [E_{15}E_{14}E_{13}E_{12}E_{11}E_{10}E_9P_1]$$

$$E'_3 = [E_7E_6E_5E_4E_{24}E_{16}E_8P_0] \quad (5)$$

The equation 5 shows that each of the four memory words $E'_0$ to $E'_3$ contains one permutation bit $P_0$, $P_1$, $P_2$ or $P_3$. The permutation bits have been shifted to positions of other bits which themselves have been shifted to the initial position of the permutation bits. The positions of these bits have thus been exchanged. In the equation 5 this exchange can be recognized in the memory word $E'_3$ in which the bits $E_8$, $E_{16}$, $E_{24}$, originally present in the memory words $E_0$, $E_1$ and $E_2$, are now present in the memory word $E'_3$ as a result of the reordering.

Because of this permutation and reordering of the permuted bits $P_0$ to $P_3$, the four memory words $E'_0$ to $E'_3$ in conformity with the equation 5 have the property that they change approximately equally frequently after every incrementing operation, after the application of the bijective mapping function and after the subsequent reordering, that is, in the form in which they are shown in the equation 5.

After these operations the data word formed from the four memory words in conformity with the equation 5 is to be written into the non-volatile memory 1 again as shown in the FIGURE. Because of the described properties of the memory words $E'_0$ to $E'_3$, from a statistical point of view, however, only one of these memory words will change in comparison with the memory words stored in the previous counter reading stored in the non-volatile memory 1. During the rewrite operation, therefore, only the memory word $E'_0$, $E'_1$, $E'_2$ or $E'_3$ which has actually changed will be rewritten into the non-volatile memory 1.

The number of write operations is thus reduced by the factor of 4 and hence the service life of the non-volatile memory 1 is prolonged accordingly.

Thus, after this write operation the non-volatile memory 1 contains the new data word in which possibly only one memory word has changed. This data word is present therein, however, in permuted form, that is, in the form in which the four permutation bits appear in permuted form. Furthermore, these bits have been reordered. For the next counting operation in the working memory 2 this data word must be read from the non-volatile memory 1 and prior to the execution of the incrementing process the permutation bits have to be shifted to the original position again. The same holds, of course, for those bits which have changed position with the permutation bits. Furthermore, the permutation of the four permutation bits $P_0$ to $P_3$ is to be cancelled again by application of the inverse bijective mapping function, so that the least significant bits $C_0$ to $C_3$ are again present in original form in the working memory 2. The incrementing operation for the data word in the working memory 2 by means of the control circuit 3 can be executed only after that. After the execution of the incrementing operation, the working memory 2 again contains a new data word C for which the described operations are repeated.

The properties of the bijective mapping function (also referred to as permutation) will be described in detail hereinafter. This description will be given with reference to the following Table 1:

TABLE 1

| $C_3$ | $C_2$ | $C_1$ | $C_0$ |   | $P_3$ | $P_2$ | $P_1$ | $P_0$ |
|---|---|---|---|---|---|---|---|---|
| 0 | 0 | 0 | 0 | <=> | 0 | 0 | 0 | 0 |
| 0 | 0 | 0 | 1 | <=> | 0 | 0 | 0 | 1 |
| 0 | 0 | 1 | 0 | <=> | 0 | 0 | 1 | 1 |
| 0 | 0 | 1 | 1 | <=> | 0 | 0 | 1 | 0 |
| 0 | 1 | 0 | 0 | <=> | 0 | 1 | 1 | 0 |
| 0 | 1 | 0 | 1 | <=> | 0 | 1 | 1 | 1 |
| 0 | 1 | 1 | 0 | <=> | 1 | 1 | 1 | 1 |
| 0 | 1 | 1 | 1 | <=> | 1 | 0 | 1 | 1 |
| 1 | 0 | 0 | 0 | <=> | 1 | 0 | 0 | 1 |
| 1 | 0 | 0 | 1 | <=> | 1 | 1 | 0 | 1 |
| 1 | 0 | 1 | 0 | <=> | 0 | 1 | 0 | 1 |
| 1 | 0 | 1 | 1 | <=> | 0 | 1 | 0 | 0 |
| 1 | 1 | 0 | 0 | <=> | 1 | 1 | 0 | 0 |
| 1 | 1 | 0 | 1 | <=> | 1 | 1 | 1 | 0 |
| 1 | 1 | 1 | 0 | <=> | 1 | 0 | 1 | 0 |
| 1 | 1 | 1 | 1 | <=> | 1 | 0 | 0 | 0 |

The first columns of the Table show the four least significant bits of the data word in conformity with the equation 1. As has already been stated, it has been assumed that the incrementing takes place with a counting step width equal to 1. The first four columns of the Table show how the four least significant bits $C_0$ to $C_3$ are incremented. These four least significant bits are the bits within the data word C in conformity with the equation 1 which change most frequently and hence determine the frequency of writing in the non-volatile memory 1.

The four columns at the right in the Table show the four permutation bits in permuted form as $P_0$ to $P_3$. The Table is to be interpreted in such a manner that on one line of the Table the four bits at the left are entered in non-permuted form and those at the right in permuted form. In other words, the four bits $C_0$ to $C_3$ in the representation of the left-hand part of the table are transformed into the permutation bits $P_0$ to $P_3$ shown at the right of the Table when the bijective mapping function is applied. Analogously, upon the inverse bijective mapping the four permutation bits are converted back to their original values by means of the Table.

The requirements imposed on the permutation bits $P_0$ to $P_3$, and hence on the properties of the bijective mapping function, are such that, from a statistical point of view, each time only one of the four permutation bits $P_0$ to $P_3$ changes after the execution of an incrementing operation.

This can be readily demonstrated on the basis of the Table shown above.

The left-hand part of the Table shows the four non-permuted least significant bits $C_0$ to $C_3$ in 16 counting steps.

The right-hand part of the Table shows the same bits in permuted form as the permutation bits $P_0$ to $P_3$. It appears that from one data set to another only one bit of the permutation bits $P_0$ to $P_3$ changes after every incrementing operation. For example, from line 1 to line 2 in the representation of the Table only the bit $P_0$ changes. From line 2 to line 3 of the Table only the bit $P_1$ changes. The same holds for each of the counting steps in conformity with the Table. For an overall cycle of 16 counting steps it can also be seen that each of the permutation bits $P_0$ to $P_3$ changes exactly four times. Thus, this permutation ensures that after every counting step the four least significant bits $C_0$ to $C_3$, after application of the bijective mapping function, change equally frequently in permuted form as permutation bits $P_0$ to $P_3$, and that in each counting step each time only one of these permutation bits $P_0$ to $P_3$ changes.

The permutation of the least significant bits $C_0$ to $C_3$ to the permuted permutation bits $P_0$ to $P_3$ as shown in the Table can in principle be realized by trial and error, meaning that the appearance of the permutation bits in the right-hand part of the Table may in principle be arbitrary for as long as the permutation bits $P_0$ to $P_3$ satisfy the above conditions. It has been found that it is not possible to indicate a systematic or mathematical rule for the formation of the bijective imaging function. No general mathematical formule is known which could provide a generally valid description of the formation of such a bijective mapping rule.

A half-way systematic possibility for obtaining a series of data words of the permutation bits $P_0$ to $P_3$ (as shown in the right-hand part of the Table) consists in the use of a search tree. Starting, for example, from the first data word of the permutation bits a search tree is formed by means of the bits 0000; in this search tree new data words are entered at each new level of the, in which new data words only one bit has changed each time on the basis of the permutation word of the preceding level. Thus, continuously new levels are formed with permutation words in which only one bit has changed in comparison with the preceding level. It is thus possible to construe a search tree along the branches of which permutation words are formed in conformity with the right-hand part of the Table. However, it should be stated that for each branch of the search tree and for each permuted bit the frequency of change over all search tree levels thus far, starting with the root, is to be noted. The maximum permissible frequency of change for each bit then equals the quotient, rounded off to the next larger even number, of the number of counting steps divided by the number of permutation bits. In the case of four permutation bits and hence 16 feasible counting steps, therefore, a value 4 is obtained for the maximum frequency of change. When this value is exceeded, the search in this branch of the tree is terminated. Furthermore, at each level of the branches of the search tree those permutation words which already occurred at higher levels in the branch are deleted. Thus, some branches will become irrelevant and be terminated already during the formation of the search tree, because these branches do not satisfy these conditions. After completion of the search tree, however, there will also be branches which satisfy said conditions. The permutation words along such branches then represent the permutation words in the right-hand part of the Table. For example, for four permutation bits these words are 16 data words which are then situated along a branch of the search tree. These permutation words are then used for the bijective mapping function in conformity with the above Table. This just means that the permutation words replace, as described above for the Table, the original least significant bits $C_0$ to $C_3$ in conformity with the Table.

The use of the search tree strategy thus enables the permutation data words to be systematically obtained. The bijective mapping function is then obtained in conformity with the representation of the above Table, that is, in such a manner that for each constellation of the four least significant bits $C_0$ to $C_3$ there is specified a corresponding constellation of the permuted bits $P_0$ to $P_3$, that is, of the permutation words.

The arrangement in accordance with the invention can be advantageously used for radio key systems for vehicles which operate with a so-called escape method. A sufficiently large counter (32 bits in the present example) in the radio key is then incremented in response to each depression of a key. The binary value of the counter is then encrypted by means of cryptographic methods. The encrypted information thus obtained as regards the counter reading is applied to the vehicle. A logic unit in the vehicle can then verify the correctness of the transmitted encrypted information on the basis of the knowledge of the instantaneous counter reading and the cryptographic algorithm so that it can activate the relevant functions. A radio key of this kind is battery-operated, so that the non-volatile memory 1 in conformity with the FIGURE is constructed as an EEPROM, thus ensuring that the content of the radio key is not lost in the case of a change of battery. EEPROMs of this kind, however, have the drawback that the number of possible write operations is limited and hence also the service life of such a system. As described above, the arrangement in accordance with the invention enables, for example, in the case of data words of 32 bits and memory words of 8 bits in the EEPROM, a reduction of the number of write operations by a factor of four and hence a corresponding prolongation of the service life of the system in the radio key.

The invention claimed is:

1. A method for realizing a binary counter which decrements or increments a partly permuted data word that is stored in a non-volatile memory, is provided with a counter and a working memory, and a data word being stored in the form of at least two memory words in the non-volatile memory, the method comprising:

reading the memory words of the data word from the non-volatile memory and storing the memory words in the working memory while performing an inverse reordering of k permutation bits of the data word;

applying an inverse bijective mapping function to the k permutation bits of the data word;

decrementing or incrementing the data word;

applying a bijective mapping function to the k permutation bits of the data word;

performing a reordering of the k permutation bits; and checking for each memory word whether it deviates from the memory word stored in the non-volatile memory and storing only those memory words in the non-volatile memory again for which this is the case, in order to increment a data word stored in the non-volatile memory, the bijective mapping function being such that the k least significant bits of the data word, representing the k permutation bits whereto the mapping function is applied, change as infrequently as possible and approximately equally frequently due to the decrementing or incrementing after application of the mapping function, the reordering being performed in such a manner that the k permutation bits of the data word in the working memory are distributed among k memory words in the volatile memory.

2. The method as claimed in claim 1, characterized in that the reordering is performed in such a manner that those permutation bits whose positions in the memory words change upon reordering change position with other bits in the memory words.

3. The method as claimed in claim 1, characterized in that a step width during decrementing or incrementing amounts to one and that the number k of permutation bits is equal to the number of memory words of a data word.

4. The method as claimed in claim 1, characterized in that a data word comprises 32 bits and each memory word comprises 8 bits.

5. The method as claimed in claim 1, characterized in that the bijective mapping function is conceived to be such that only one bit in the data word changes during every decrementing or incrementing operation.

6. The method as claimed in claim 1, characterized in that the bijective mapping function is formed in such a manner that for each feasible value of the data word the permuted data word is stored in a table.

7. The method as claimed in claim 1, characterized in that the bijective mapping function is derived by employing a search tree strategy in which:

for each search tree level all those feasible new permutation words, containing the k permutation bits in permuted form, are entered in which only one bit is changed with respect to the next higher search tree level;

for each bit the frequency of change over all search tree levels is noted, the maximum permissible frequency of change for each bit being equal to the quotient, rounded off to the next higher even number, of the number of counting steps divided by the number of permutation bits, being the number of permuted bits;

at each level those permuted data words which already occurred at higher levels in the branch are deleted; and an arbitrary one of the branches is selected so as to deliver the permuted data words which can be formed across all levels while satisfying said conditions.

* * * * *